(12) United States Patent
Lefevre

(10) Patent No.: US 6,519,269 B1
(45) Date of Patent: *Feb. 11, 2003

(54) WAVELENGTH TUNEABLE LASER SOURCE

(75) Inventor: Hervé Lefevre, Paris (FR)

(73) Assignee: Photonetics, Marly le Roi (FR)

( * ) Notice: Subject to any disclaimer, the term of this patent is extended or adjusted under 35 U.S.C. 154(b) by 0 days.

This patent is subject to a terminal disclaimer.

(21) Appl. No.: 09/503,209

(22) Filed: Feb. 14, 2000

(30) Foreign Application Priority Data

Feb. 15, 1999 (FR) .............................. 99 01788

(51) Int. Cl.⁷ .............................. H01S 3/10; H01S 3/08
(52) U.S. Cl. ........................ 372/20; 372/99; 372/102
(58) Field of Search ........................ 372/20, 102, 98, 372/99, 94

(56) References Cited

U.S. PATENT DOCUMENTS 5,594,744 A * 1/1997 Lefevre et al. ............... 372/20
5,802,085 A * 9/1998 Lefevre et al. ............... 372/20
5,886,785 A * 3/1999 Lefevre et al. ............. 356/328
6,339,609 B2 * 1/2002 Lefevre ....................... 372/99

FOREIGN PATENT DOCUMENTS

EP 0030891 6/1981
FR 2724496 3/1996

OTHER PUBLICATIONS

An English language abstract of JP 57 099793.
XP 000852817 to T.T. Basiev et al., "Powerful Single Mode Nd Lasers with Self Phase Conjugation", Proceedings of the International Conference on Lasers '98.

* cited by examiner

Primary Examiner—Paul Ip
Assistant Examiner—James Menefee
(74) Attorney, Agent, or Firm—Arent Fox Kintner Plotkin & Kahn PLLC

(57) ABSTRACT

A wavelength tuneable laser source with an external cavity and utilizing an interferometer having a reciprocal output and a non-reciprocal output. The laser source includes an amplifier medium, a cavity comprising two reflectors and a source beam extraction system, a diffraction grating located in the cavity. At least one of the two reflectors are rotatable so as to tune a wavelength. The source beam extraction mechanism includes a beam splitter for splitting an input beam into first and second secondary beams. The first and second secondary beams are parallel to one another. The source beam extraction mechanism also includes a retro-reflecting mechanism for redirecting the first and second secondary beams toward the beam splitter. A non-reciprocal output beam is obtained from a reciprocal source beam using the interferometer.

17 Claims, 2 Drawing Sheets

WAVELENGTH TUNEABLE LASER SOURCE

FIELD OF THE INVENTION

This invention relates to a wavelength tuneable laser source, the tuning of which can be continuous, which provides the extraction of the output light beam in optimised conditions, losing a minimum of energy.

In a particular embodiment, the background noise resulting from the ASE (Amplified Spontaneous Emission) is filtered spectrally and that exhibits therefore better efficiency at the emission wavelength of the laser.

BACKGROUND OF THE INVENTION

A laser usually comprises a cavity in which an amplifier medium is placed. Various means are known to output the useful or source beam.

The most usual is to provide a semi-reflector at one of the ends of the cavity. The beam transmitted by this semi-reflector is the source beam.

However, such a device does not always give satisfaction, particularly when a light beam without ASE is required. It is known that to get such a free ASE light beam, a diffraction grating for filtering the ASE has to be provided in the cavity. The output light beam has then to be extracted after its diffraction by the grating and before it is another time amplified by the amplifier medium.

It is then possible to put a semi-reflecting thin plate in the cavity to get the free ASE beam by reflection one of its faces. However this involves important energy losses by reflection on the other face of the plate.

The constraints are still more important with tunable sources with an external cavity. The tuning of the output[]beam wavelength generally needs the diffraction grating to be rotated. Various means have been proposed to output a free ASE beam but they command a rotation of the direction of the output beam when the wavelength is tuned.

SUMMARY OF THE INVENTION

The object of the invention is toxpropose a tunable laser source with an external cavity in which the output of the beam is optimized and which avoids the drawbacks of the previous solutions as mentioned above.

The invention then relates to a wavelength tuneable laser source with external cavity comprising an amplifier, medium, a cavity, a diffraction grating placed in the cavity comprising two reflectors one of which is able to rotate so as to tune the wavelength and source beam extraction mechanism.

According to the invention, the source beam extraction mechanism comprises a beam splitter giving a first secondary beam and a second secondary beam, parallel to one another as well as retroreflecting mechanism redirecting each secondary beams toward the beam splitter and forming a Sagnac interferometer having a reciprocal output and a non-reciprocal output, the source beam being obtained on the Sagnac interferometer non-reciprocal out put beam.

Preferably, in various embodiments of the invention each having their respective advantages:

the extraction mechanism is placed between the amplifier medium and the grating.

the amplifier medium is a wave guide and it is associated with collimation optics that collimate the beam thereby produced.

the external face of the wave guide is totally reflecting and the non reciprocal beam is the single beam transmitted by the source.

one of the cavity reflectors is a unidimensional self-aligned reflector.

the beam splitter is self-aligned.

the diffraction grating forming with the total reflector a Littman-Metcalf system.

the reflector which is mobile in rotation is also mobile in translation to enable continuous variation of the wavelength it comprises several amplifier guides that are offset at an angle with respect to the retroreflecting-dispersing device and enabling the emission of the source over several wavelengths.

BRIEF DESCRIPTION OF THE DRAWINGS

The invention will be described more in detail with reference to the appended drawings on which.

DETAILED DESCRIPTION OF THE PREFERRED EMBODIMENTS

Figure 1:
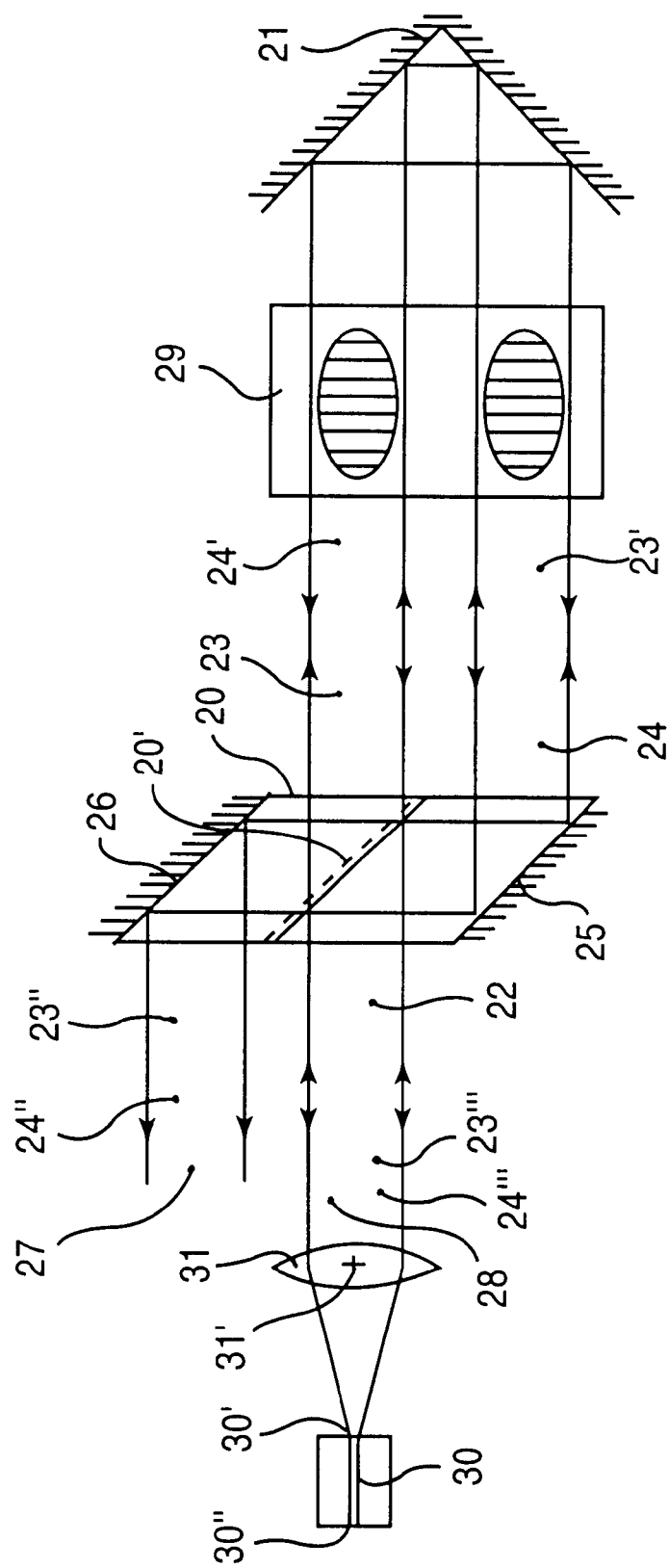
FIG. 1 is a side view of a laser according to the invention.
Figure 2:
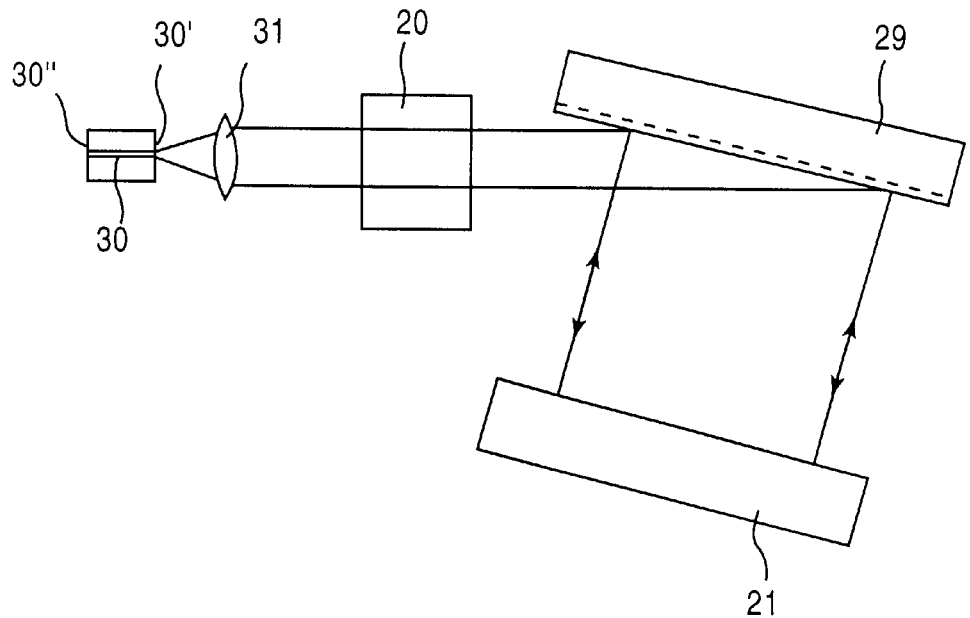
FIG. 2 is an above view of a laser according to the invention.

The wavelength tunable laser source with an external cavity comprises an amplifier medium 30, a resonant cavity, a diffraction grating 29 placed within the cavity. The cavity comprises two reflectors 21 and 30" one of which is able to rotate so as to tune the wavelength.

The output mechanism of the source beam comprises a beam splitter 20 giving a first secondary beam 23 and a second secondary beam 24, parallel to one another as well as retroreflecting mechanism (21,25,26) redirecting each of the secondary beams toward the beam splitter 20.

This beam splitter 20 together with the retroreflecting mechanism (21,25,26) form a Sagnac interferometer having a reciprocal output 28 and a non-reciprocal output 27. The source beam being obtained on the Sagnac interferometer non-reciprocal out put seam. This Sagnac interferometer is set with match phase fronts.

An amplifier medium, preferably an amplifier wave-guide 30, whose internal extremity 30' is placed at the focus of the collimation lens 31 of centre 31', generates the collimated input beam 22. The external face 30' of this amplifier wave-guide 30 is entirely reflecting, and the splitter 20 is unbalanced. Thus, a laser cavity is formed between the entirely reflecting face 30" and the self-aligned total reflector 21 through the reciprocal output where the beam 28 is superimposed to the input beam 22. The offset non-reciprocal output 27 makes up the laser output and forms therefore the transmitted beam.

The presence of a grating 29 in the Littman-Metcalf configuration with the self-aligned total reflector 21, in this laser source, enables the non-reciprocal output 27 to filter spectrally the continuous spurious background, with ASE radiation, and thereby to isolate the transmission line of the laser.

The transmission wavelength adjustment can be obtained either by rotating the grating or by rotating the total reflector 21 or still by rotating the assembly formed by the grating 29 and the total reflector 21, whereas the filtered non-reciprocal beam 27 remains stable since it is parallel to the input beam. This beam can be coupled optionally in a monomode optic fibre.

A rotation and/or translation coordinated movement of the reflecting dihedron 21 with the movement of the grating 29 enables to provide a continuous tuneable laser source. Such a coordinated movement is for example disclosed in French patent FR-2.724.496.

Such a laser source can also be made with several amplifier media or wave-guides 30 located in the focal plane of the lens 31. This allows us to provide a multiwavelength source, formed by the superimposition of several laser fluxes, each corresponding to a wave-guide and whose wavelength depends on the angle from which the wave-guide can be seen from the reflecting dispersing device.

The self-aligned splitter 20 divides the input beam 22 into two parallel beams: i.e. a first split beam 23 and a second split beam 24 propagating through free space. The first split beam 23 is reflected by the self-aligned reflector 21 and forms a reflected split beam 23' that is directed to the beam splitter 20, that reflects it partially and transmits it partially. The transmitted beam 23" is sent back in parallel and in the reverse direction of the input beam 22.

The beam reflected by the splitter 20 is a beam 23" superimposed and of reverse direction to the input beam 22. Similarly, the beam 24 generated from the input beam 22 by reflection onto the splitter 20, is itself reflected by the total reflector 21 and forms the beam 24' that is sent back to the splitter 20 that divides it into two beams, respectively 24" and 24''', which interfere with the beams 23" and 23''' thus generating two output beams, respectively 27 and 28, parallel to one another. The beam 28 is produced by interference of the beams 23''' and 24''' that have each been exposed to a single reflection on the splitter 20. This so-called reciprocal beam 28 is superimposed to the input beam 22 and of reverse direction.

Conversely, the beam 27 is generated by the interferences of the beam 23" that has not been exposed to any reflection on the splitter 20 and of the beam 24" that has been exposed to two reflections on the same splitter. This difference in the number of reflections to which each beam is exposed, provides π-radian phase shift and the output 27 is called a non-reciprocal output.

Implementing the self-aligned total reflector 21 facilitates the adjustment of the device and improves therefore its yield.

When the splitter 20 is a 50/50 splitter, the intensity of the split beams 23 and 24 is equal and during their recombination, the whole energy is gathered on the reciprocal output into one beam 28, whereby the beam 27, further to the phase shift between the waves of the beams 24" and 23", has a zero energy. i.e. the phase shift does not exist.

It is possible to use an energy-unbalanced splitter 20, enabling the distribution of the incident energy between both output beams 27 and 28. R and T being respectively the coefficients of energy reflection and transmission of the splitter 20, the incoming energy can be found at the non-reciprocal output (1–4 RT). For instance with R=90% and T=10%, we obtain (1–4 RT)=64% at the non-reciprocal output.

The self-aligned splitter 20 can be advantageously a periscope splitter comprising a splitting interface 20' and two mirrors 25 and 26 that are parallel to the former.

The figures and the description have been made while using as a self-aligned reflector, a dihedron, but similar results can be obtained by using a so called "unidimensional cat's eye" i.e. a cylindrical lens together with a plane mirror placed in its focal plan. The dihedron can be formed by plane mirrors, but also made out of a rectangular isosceles prism, operating in total internal reflection.

Figure 3:
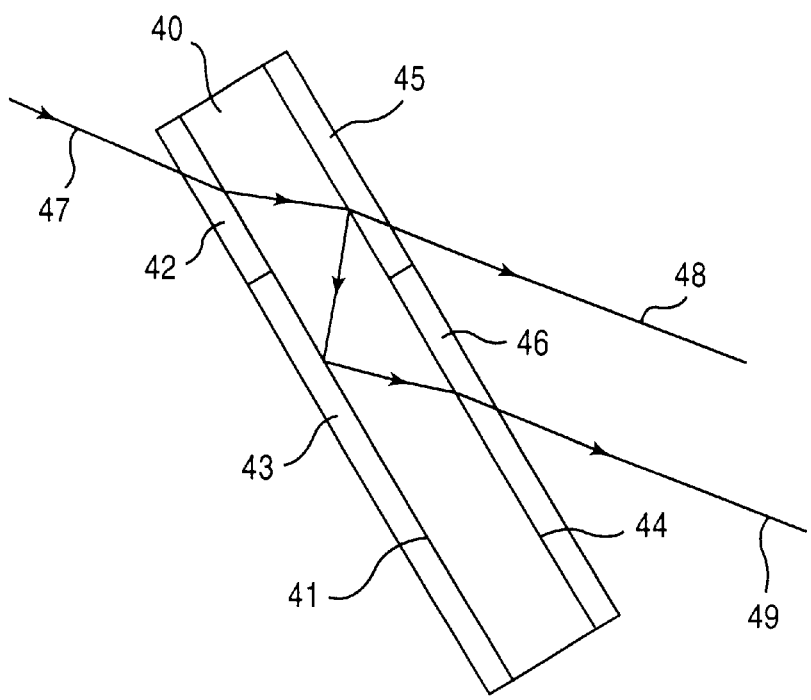
FIG. 3 represents a blade with parallel faces usable as a self-aligned beam splitter.

It has been mentioned above that the self-aligned splitter 20 can be a periscopic splitter. It can also be a blade with parallel faces. Such a blade 40 is represented on FIG. 3.

Its input face 41 is partially coated with an antiglare coating 42 and a fully reflecting coating 43.

Its output face 44 is partially coated with a partially reflecting coating 45 and, on another area, an antiglare coating 46.

Thus, an incident beam 47 is partially transmitted at 48 and the residual flux is transmitted, after two reflections at 49. The required function is thereby achieved.

What is claimed is:

1. A wavelength tuneable laser source with an external cavity and utilizing an interferometer having a reciprocal output and a non-reciprocal output, the laser source comprising:

an amplifier medium;

a cavity comprising two reflectors and a source beam extraction system;

a diffraction grating located in the cavity;

at least one of the two reflectors being rotatable so as to tune a wavelength;

the source beam extraction mechanism comprising a beam splitter for splitting an input beam into first and second secondary beams, the first and second secondary beams being parallel to one another, and a retro-reflecting mechanism for redirecting the first and second secondary beams toward the beam splitter, wherein a non-reciprocal output beam is obtained from a reciprocal source beam using the interferometer.

2. The laser source of claim 1, wherein the source beam extraction mechanism is located between the amplifier medium and the diffraction grating.

3. The laser source of claim 1, wherein the amplifier medium comprises a wave-guide.

4. The laser source of claim 3, further comprising a collimating optical device located between the wave-guide and the beam splitter.

5. The laser source of claim 3, further comprising a collimation optical device for collimating the input beam.

6. The laser source of claim 3, wherein the wave-guide comprises an external face which is totally reflecting.

7. The laser source of claim 1, wherein at least one of the two reflectors comprises a uni-dimensional self-aligned reflector.

8. The laser source of claim 7, wherein the beam splitter comprises a self-aligned beam splitter.

9. The laser source of claim 1, wherein the beam splitter comprises a self-aligned beam splitter.

10. The laser source of claim 1, further comprising a Littman-Metcalf system, wherein the Littman-Metcalf system comprises the diffraction grating and a total reflector.

11. The laser source of claim 10, wherein the diffraction grating is located between the beam splitter and the total reflector.

12. The laser source of claim 1, wherein the at least one rotatable reflector is also moveable in at least one other direction.

13. The laser source of claim 1, further comprising a retro-reflecting dispersion device and a plurality of amplifier guides which are offset at an angle with respect to the retro-reflecting dispersion device, wherein the plurality of amplifier guides enable the laser to transmit the input beam over a plurality of wavelengths.

14. The laser source of claim 1, wherein the retro-reflection mechanism comprises a dihedron which is rotatable for varying a wavelength.

15. The laser source of claim 14, wherein the dihedron is moveable towards and away from the beam splitter so as to continuously vary the wavelength.

16. The laser source of claim 14, wherein the dihedron is moveable so as to vary the wavelength.

17. The laser source of claim 1, wherein the interferometer comprises a Sagnac type interferometer.

* * * * *